US012805233B2

(12) United States Patent
Kawano

(10) Patent No.: US 12,805,233 B2
(45) Date of Patent: Nov. 17, 2026

(54) PROCESSING METHOD OF SUBSTRATE AND MANUFACTURING METHOD OF CHIPS

(71) Applicant: DISCO CORPORATION, Tokyo (JP)

(72) Inventor: Fumiya Kawano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 459 days.

(21) Appl. No.: 18/465,268

(22) Filed: Sep. 12, 2023

(65) Prior Publication Data

US 2024/0105511 A1 Mar. 28, 2024

(30) Foreign Application Priority Data

Sep. 28, 2022 (JP) ................................ 2022-154396

(51) Int. Cl.
*H10P 54/00* (2026.01)
*H10P 34/42* (2026.01)

(52) U.S. Cl.
CPC .............. *H10P 54/00* (2026.01); *H10P 34/42* (2026.01)

(58) Field of Classification Search
CPC .............................. H01L 21/78; H01L 21/268
See application file for complete search history.

(56) References Cited

U.S. PATENT DOCUMENTS

| | | | | |
|---|---|---|---|---|
| 2014/0256150 A1 | | 9/2014 | Morikazu et al. | |
| 2015/0166395 A1* | | 6/2015 | Marjanovic | B23K 26/384 428/131 |
| 2016/0023436 A1 | | 1/2016 | Liu et al. | |
| 2016/0260630 A1* | | 9/2016 | Morikazu | B23K 26/032 |
| 2017/0221763 A1* | | 8/2017 | Morikazu | H01L 21/78 |
| 2021/0074588 A1* | | 3/2021 | Harada | H01L 21/6838 |
| 2022/0093579 A1* | | 3/2022 | Kishimoto | H10H 20/018 |
| 2022/0134475 A1 | | 5/2022 | Gaab et al. | |

FOREIGN PATENT DOCUMENTS

JP 2014168790 A 9/2014

OTHER PUBLICATIONS

Office Action issued in counterpart German patent application No. 10 2023 209 145.3, dated Mar. 21, 2025.
Office Action issued in counterpart Japanese Patent Application No. 2022-154396, dated Mar. 17, 2026.

* cited by examiner

*Primary Examiner* — Mohammad M Choudhry
(74) *Attorney, Agent, or Firm* — GREER BURNS & CRAIN, LTD.

(57) ABSTRACT

A processing method of a substrate performs processing using a laser beam having a wavelength that transmits through a material constituting the substrate and focused in a region of a greater length along a thickness direction of the substrate than a width along a direction perpendicular to the thickness direction. The processing method includes a shield tunnel forming step of forming shield tunnels, each of which includes a fine pore opening in at least one of a front surface or a back surface of the substrate and an amorphous portion surrounding the fine pore, by applying the laser beam to the substrate such that at least a part of the region is positioned inside the substrate, and a function layer forming step of, after the shield tunnel forming step, forming a function layer on the front surface. A manufacturing method of chips is also disclosed.

20 Claims, 10 Drawing Sheets

PROCESSING METHOD OF SUBSTRATE AND MANUFACTURING METHOD OF CHIPS

BACKGROUND OF THE INVENTION

Field of the Invention

The present invention relates to a processing method of a substrate, the method performing processing of the substrate with use of a laser beam having a wavelength that transmits through the substrate and being focusable in a region of a greater length along a thickness direction of the substrate than a width along a direction perpendicular to the thickness direction, and also to a manufacturing method of chips, the method performing manufacture of the chips from the substrate with use of the processing method.

Description of the Related Art

Chips of semiconductor devices such as integrated circuits (ICs) or optical devices like light-emitting diodes (LEDs) or laser diodes (LDs) are manufactured using a disk-shaped substrate made from a single crystal material such as, for example, silicon, silicon carbide, or sapphire.

Described specifically, such chips are manufactured by forming a function layer, which includes a conductive film, a semiconductor film, and/or an insulation film, on a front surface of the substrate to constitute the devices, and then dividing the substrate along boundaries of the devices.

Known as a method for dividing a substrate is a method which uses a laser beam having a wavelength that transmits through a material constituting the substrate and being focusable in a region of a greater length along a thickness direction of the substrate than a width along a direction perpendicular to the thickness direction (see, for example, JP 2014-168790A).

In this method, the laser beam is first applied to the substrate along the boundaries of the devices with the region, in which the beam is focused, positioned inside the substrate. As a consequence, shield tunnels (filaments), each of which includes a fine pore and an amorphous portion surrounding the fine pore, are formed inside the substrate. In this method, etching is applied to the substrate such that the shield tunnels are removed. As a result, chips are manufactured from the substrate.

SUMMARY OF THE INVENTION

If a laser beam is applied from a side of a front surface of a substrate with a function layer formed on the front surface, the advancing direction of the laser beam may change in the function layer, thereby causing a possible problem in that desired shield tunnels may be hardly formed in the substrate. If the laser beam is applied from a side of a back surface of the substrate, on the other hand, there is a possible problem in that the function layer may be damaged by the laser beam reaching the side of the front surface of the substrate.

With these possible problems in view, the present invention has as objects thereof the provision of a processing method of a substrate, which can form desired shield tunnels in the substrate without damaging a function layer for a configuration of a plurality of devices, and a manufacturing method of chips, which manufactures the chips from the substrate with use of the processing method.

In accordance with a first aspect of the present invention, there is provided a processing method of a substrate, the method performing processing of the substrate with use of a laser beam having a wavelength that transmits through a material constituting the substrate and focused in a region of a greater length along a thickness direction of the substrate than a width along a direction perpendicular to the thickness direction. The processing method includes a shield tunnel forming step of forming shield tunnels, each of which includes a fine pore opening in at least one of a front surface or a back surface of the substrate and an amorphous portion surrounding the fine pore, by applying the laser beam to the substrate such that at least a part of the region is positioned inside the substrate, and a function layer forming step of, after the shield tunnel forming step, forming a function layer on the front surface of the substrate.

Preferably, the processing method may further include, between the shield tunnel forming step and the function layer forming step, an etching step of etching the shield tunnels from the at least one of the front surface or the back surface, the at least one having the fine pore opening therein.

In accordance with a second aspect of the present invention, there is provided a manufacturing method of chips, the method performing manufacture of the chips from a substrate with use of a laser beam having a wavelength that transmits through a material constituting the substrate and focused in a region of a greater length along a thickness direction of the substrate than a width along a direction perpendicular to the thickness direction. The manufacturing method includes a shield tunnel forming step of forming shield tunnels, each of which includes a fine pore opening in at least one of a front surface or a back surface of the substrate and an amorphous portion surrounding the fine pore, by applying the laser beam to the substrate such that at least a part of the region is positioned inside the substrate, an etching step of, after the shield tunnel forming step, etching the shield tunnels from the at least one of the front surface or the back surface, the at least one having the fine pore opening therein, a function layer forming step of, after the etching step, forming a function layer on the front surface of the substrate, and a dividing step of, after the function layer forming step, dividing the substrate by applying an external force to the substrate.

In the present invention, the fine pore may preferably open in only one of the front surface or the back surface of the substrate.

In the present invention, before the function layer forming step of forming the function layer on the front surface of the substrate, the shield tunnel forming step is performed to form the shield tunnels, each of which includes the fine pore opening in the at least one of the front surface or the back surface of the substrate and the amorphous portion surrounding the fine pore, respectively.

In other words, the shield tunnels in the present invention are formed in the substrate in a state that the function layer has not been formed on its front surface. In the present invention, it is therefore possible to form the shield tunnels in the substrate as desired without damaging the function layer for the configuration of a plurality of devices.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
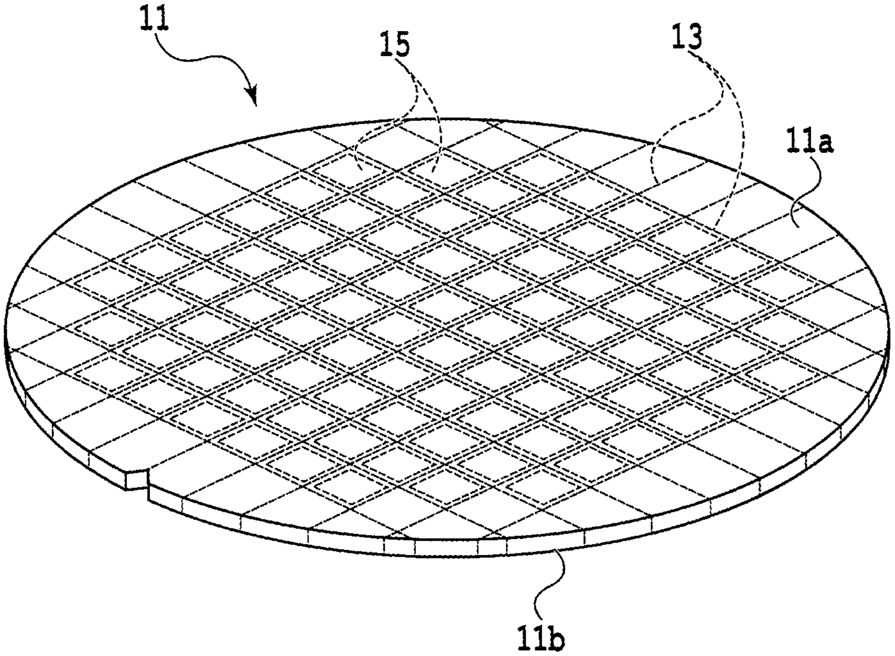
FIG. 1 is a perspective view schematically illustrating an example of a substrate to be used in manufacturing chips in the present invention.

With reference to the attached drawings, embodiments of the present invention will be described. FIG. 1 is a perspective view schematically illustrating an example of a substrate to be used in manufacturing chips in the present invention. A substrate 11 illustrated in FIG. 1 is a disk-shaped wafer, which has a circular front surface 11*a* and a circular back surface 11*b*, and is made from a single crystal material, for example, such as silicon or silicon carbide.

On the substrate 11, a plurality of intersecting scribe lines 13 is arranged in a grid pattern. The substrate 11 is defined into a plurality of regions 15 by the scribe lines 13, and on the front surface 11*a* in each region 15, a function layer is formed to constitute a device as will be mentioned below.

The chips are manufactured by dividing the substrate, in each region 15 of which the function layer is formed, along the respective scribe lines 13. It is to be noted that no limitations are imposed on the material, shape, construction, size, and the like of the substrate 11. For example, the substrate 11 may be made from another single crystal material such as sapphire.

Figure 2:
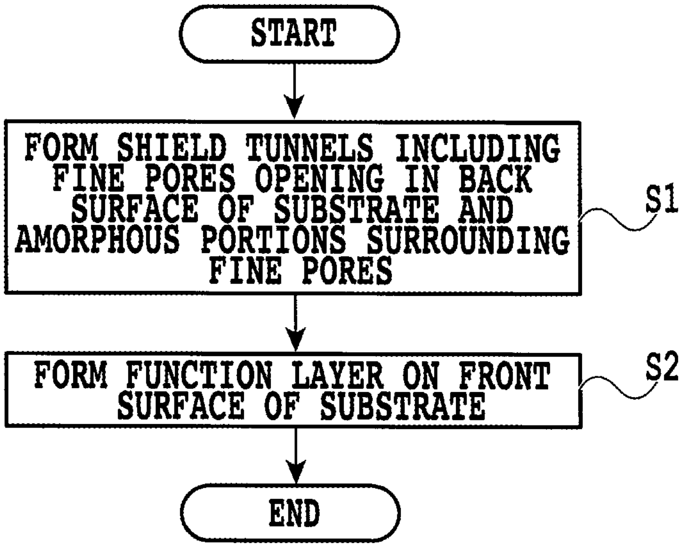
FIG. 2 is a flow chart schematically illustrating a processing method according to a first embodiment of a first aspect of the present invention for a substrate, in which the substrate is processed using a laser beam.

FIG. 2 is a flow chart schematically illustrating a processing method according to a first embodiment of a first aspect of the present invention, in which the substrate 11 is processed using a laser beam. In the processing method of the first embodiment, shield tunnels 19 are formed in the substrate 11, including fine pores 19*a* opening in the back surface 11*b* of the substrate 11 and amorphous portions 19*b* surrounding the fine pores 19*a*, respectively (see FIGS. 3A and 3B; shield tunnel forming step S1).

Figure 3A:
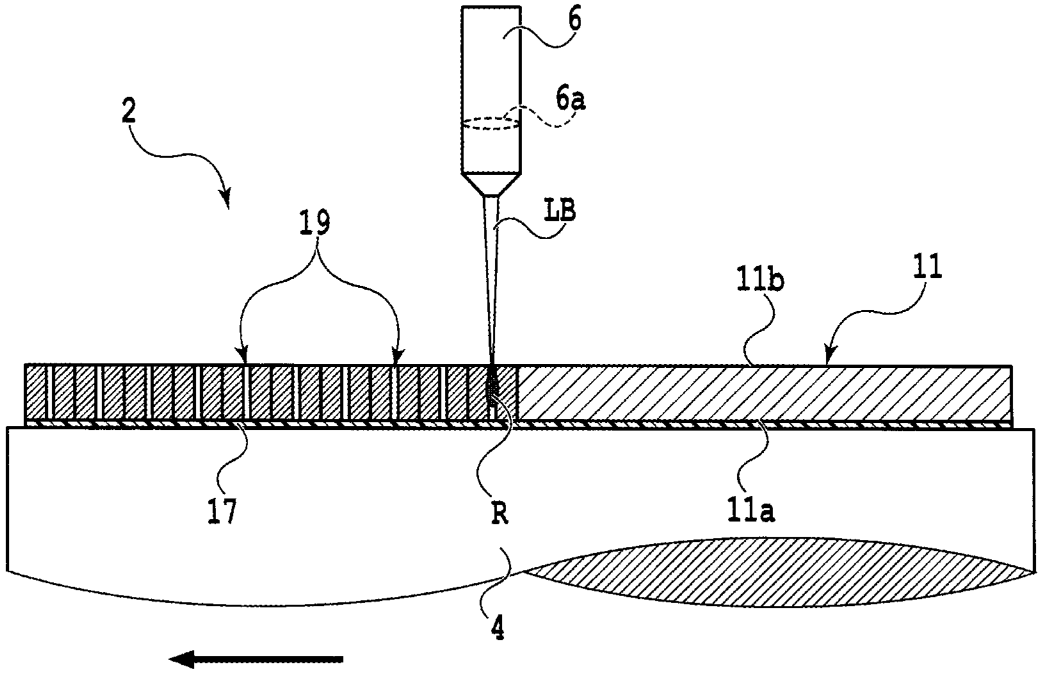
FIG. 3A is a partial cross-sectional side view schematically illustrating how a first example of a shield tunnel forming step is performed in the processing method illustrated in FIG. 2.

FIG. 3A is a partial cross-sectional side view schematically illustrating how a first example of the shield tunnel forming step S1 is performed. Described specifically, FIG. 3A illustrates how the shield tunnels 19 are formed inside the substrate 11 in a laser processing machine 2.

The laser processing machine 2 has a disk-shaped holding table 4. The holding table 4 has an upper surface (holding surface) of, for example, a circular shape. The holding table 4 also has a disk-shaped porous plate (not illustrated), an upper surface of which is exposed in the holding surface.

Further, the porous plate is in communication with a suction source (not illustrated) such as an ejector via a flow channel formed inside the holding table 4. When this suction source is activated, a suction force acts on a space in a vicinity of the holding surface of the holding table 4. As a consequence, it is possible to hold, for example, the substrate 11, which is placed on the holding surface, on the holding table 4.

The holding table 4 is also connected to a horizontal direction moving mechanism (not illustrated). This horizontal direction moving mechanism includes, for example, a ball screw, a motor, and the like. When this horizontal direction moving mechanism is activated, the holding table 4 is moved along a horizontal direction.

Above the holding table 4, a head 6 of a laser beam irradiation unit is disposed. The laser beam irradiation unit also has a laser oscillator (not illustrated). This laser oscillator has, for example, Nd:YAG or the like as a laser medium.

The laser oscillator applies a pulsed laser beam LB of a wavelength that transmits through a material constituting the substrate 11 (for example, a wavelength of 1,064 nm). This pulsed laser beam LB has, for example, a pulse width of 10 ps, and a frequency of 50 kHz.

After this laser beam LB has been adjusted in power at an attenuator (not illustrated) (for example, its average power has been reduced to 2 W), the laser beam LB is applied directly downwards from the head 6 via an optical system (not illustrated) that includes a condenser lens 6*a* and the like disposed in the head 6.

Further, the optical system also imposes, for example, aberration (in particular, longitudinal aberration) on the laser beam LB. As a consequence, the laser beam LB is focused in a region R of a greater length along its advancing direction (a thickness direction of the substrate 11) than a width along a direction perpendicular to the advancing direction.

The head 6 of the laser beam irradiation unit is connected to a vertical direction moving mechanism (not illustrated). This vertical direction moving mechanism includes, for example, a ball screw, a motor, and the like. When this vertical direction moving mechanism is activated, the head 6 is moved along a vertical direction.

When forming the shield tunnels 19 inside the substrate 11 in the laser processing machine 2, the substrate 11 that has a protective tape 17 bonded to the front surface 11*a* thereof is first placed on the holding table 4 such that the back surface 11*b* is directed upwards. It is to be noted that the protective tape 17 is made, for example, from a resin, and has a disk shape of substantially the same diameter as the substrate 11.

Alternatively, no protective tape 17 may be bonded to the front surface 11*a* of the substrate 11 in the shield tunnel forming step S1. In other words, the substrate 11 may be placed on the holding table 4 such that the front surface 11*a* comes into direct contact with the holding surface of the holding table 4.

The suction source that is in communication with the porous plate exposed in the holding surface of the holding table 4 is next activated. As a consequence, the substrate 11 is held on the holding table 4. The holding table 4 and/or the head 6 is then adjusted in position such that an end of desired one of the scribe lines 13 on the substrate 11 and the region in which the laser beam LB is to be focused overlap each other.

While applying the laser beam LB from the head 6, the holding table 4 is next moved along a direction in which the desired one scribe line 13 extends (see FIG. 3A). As a consequence, the shield tunnels 19 are formed in an elongated zone along the desired one scribe line 13 on the substrate 11.

Figure 3B:
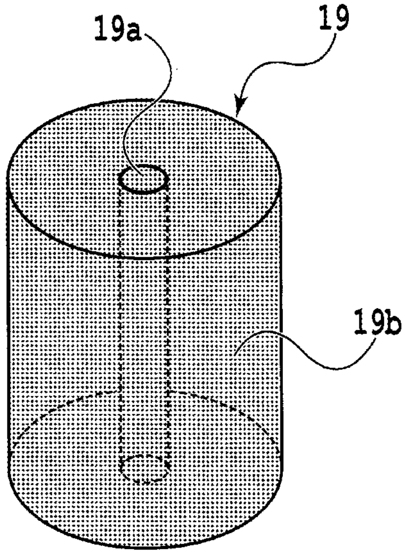
FIG. 3B is a perspective view schematically illustrating one of a plurality of shield tunnels formed inside the substrate in the first example of the shield tunnel forming step illustrated in FIG. 3A.

FIG. 3B is a perspective view schematically illustrating one of the shield tunnels 19 formed inside the substrate 11. The shield tunnel 19 includes a fine pore 19*a* opening in both the front surface 11*a* and back surface 11*b* of the substrate 11, and an amorphous portion 19*b* surrounding the fine pore 19*a*.

The above-mentioned operations are repeated further until the shield tunnels 19 are formed in all the elongated zones along the respective scribe lines 13. As a consequence, the substrate 11 is obtained with the shield tunnels 19 formed in a grid pattern as seen in a plan view.

After the shield tunnel forming step S1, a function layer is formed on the front surface 11*a* of the substrate 11 (function layer forming step S2). In this function layer forming step S2, a function layer made of a single metal film is formed on the front surface 11*a* of the substrate 11 using, for example, physical vapor deposition (PVD). It is to be noted that this function layer is used, for example, as back surface electrodes for power devices.

Figure 4A:
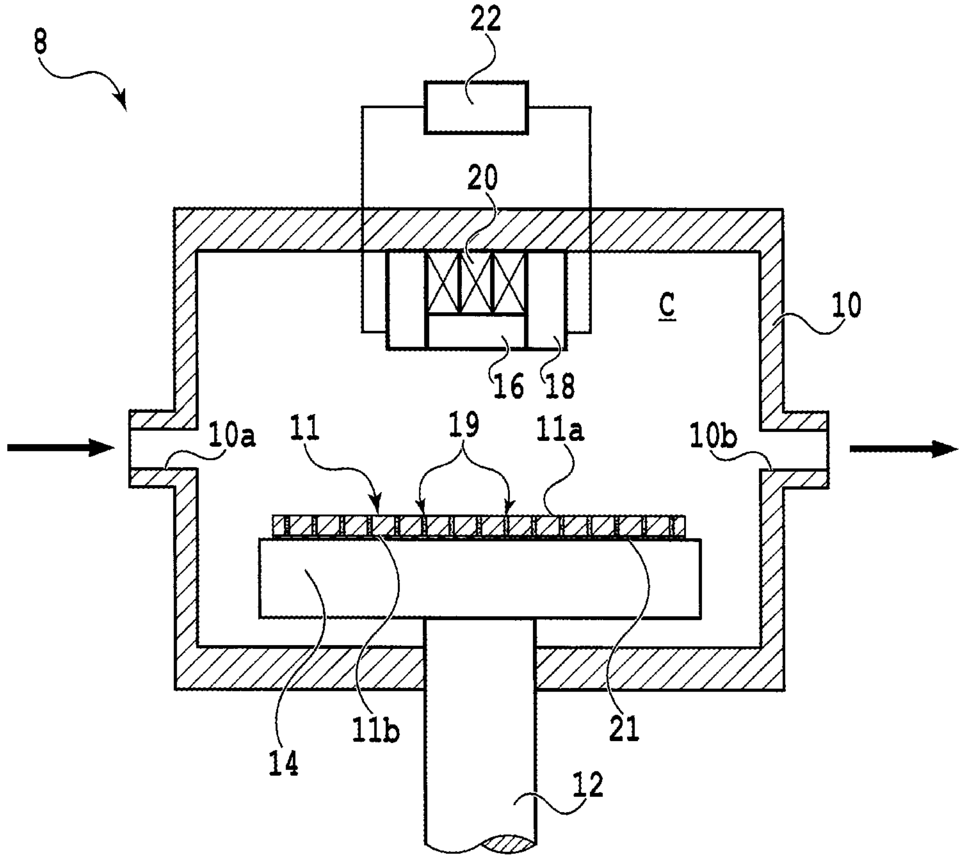
FIG. 4A is a partial cross-sectional side view schematically illustrating how a function layer forming step is performed in the processing method illustrated in FIG. 2.

FIG. 4A is a partial cross-sectional side view schematically illustrating how the function layer forming step S2 is performed. Described specifically, FIG. 4A illustrates how the metal film is formed on the front surface 11*a* of the substrate 11 in a sputtering system 8. It is to be noted that, in FIG. 4A, some of the constituent elements of the sputtering system 8 are illustrated in blocks.

The sputtering system 8 has a housing 10 that defines a chamber C. A through-hole is formed in a bottom wall of the housing 10, and a support member 12 is disposed extending through the through-hole. The support member 12 supports a holding table 14 with an electrostatic chuck disposed on a side of an upper surface thereof.

Above the holding table 14, a target 16 made from a metal material is disposed, and the target 16 is attached to an electrode 18. In a vicinity of the target 16, an exciting member 20 is disposed to excite the target 16. The target 16 is connected to a radio frequency power supply 22 via the electrode 18.

Formed in left and right side walls, respectively, of the housing 10 are a gas inlet 10*a* and a gas outlet 10*b*. The gas inlet 10*a* can be brought into communication with a supply source of sputtering gas (for example, argon or the like) via a valve (not illustrated) or the like, while the gas outlet 10*b* can be brought into communication with a suction source for depressurizing the chamber C.

When forming the metal film on the front surface 11*a* of the substrate 11 in the sputtering system 8, the protective tape 17 bonded to the front surface 11*a* of the substrate 11 is first removed, and a protective tape 21 similar to the protective tape 17 is bonded to the back surface 11*b*.

The substrate 11 is next placed on the holding table 14 with the protective tape 21 interposed therebetween such that the exposed front surface 11*a* is directed upwards. The electrostatic chuck disposed on the side of the upper surface of the holding table 14 is then activated. As a consequence, the substrate 11 is held on the holding table 14.

The suction source that is in communication with the gas outlet 10*b* is then activated to evacuate the chamber C, and the chamber C is depressurized until its internal pressure drops to $10^{-2}$ to $10^{-4}$ Pa. The radio frequency power supply 22 is then activated such that radio frequency power, for example, of 40 kHz is applied via the electrode 18 to the target 16 excited by the exciting member 20, and at the same time, the sputtering gas is supplied from the supply source into the chamber C via the valve or the like, the gas inlet 10*a*, and the like.

As a consequence, a plasma that contains ions of the sputtering gas is generated in the chamber C, and these ions strike the target 16. Metal particles sputtered from the target 16 by the striking of the ions of the sputtering gas then deposit on the front surface 11*a* of the substrate 11 to form the metal film.

Figure 4B:
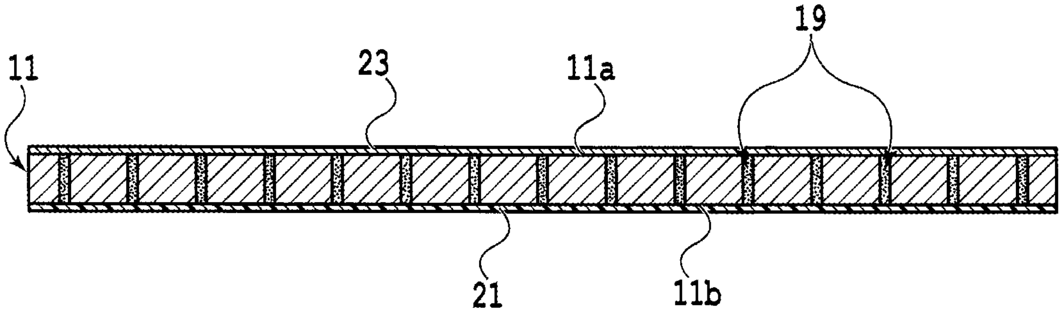
FIG. 4B is a cross-sectional view schematically illustrating the substrate with a function layer formed on a front surface thereof through the function layer forming step illustrated in FIG. 4A.

FIG. 4B is a cross-sectional view schematically illustrating the substrate 11 with a function layer 23 made of the single metal film and formed on the front surface 11*a*. It is to be noted that the function layer 23 may also be configured with a plurality of thin films. Described specifically, the function layer 23 configured with the plurality of thin films is formed by repeating the formation of a thin film by the PVD, chemical vapor deposition (CVD), or the like, and patterning of the thin film using photolithography, etching, and the like.

In the processing method of the substrate as illustrated in FIG. 2, the shield tunnel forming step S1 is performed, before the function layer forming step S2 in which the function layer 23 is to be formed on the front surface 11*a* of the substrate 11, to form the shield tunnels 19, each of which includes the fine pore 19*a* opening in both the front surface 11*a* and the back surface 11*b*, respectively, of the substrate 11 and the amorphous portion 19*b* surrounding the fine pore 19*a*.

In other words, the shield tunnels 19 are formed in the substrate 11 in a state that the function layer 23 has not been formed on its front surface 11*a*. In this method, it is therefore possible to form the shield tunnels 19 in the substrate 11 as desired without damaging the function layer 23 for a configuration of a plurality of devices.

It is to be noted that the details mentioned above are those relating to the first embodiment of the first aspect of the present invention, and the present invention is therefore not limited to the above-mentioned details. In the shield tunnel forming step S1 of the processing method of the first embodiment, for example, the shield tunnels 19 may not be required to be formed extending through the substrate 11 in the thickness direction thereof, insofar as the substrate 11 can be divided in a dividing step, which will be mentioned subsequently herein, or the like.

Figure 5:
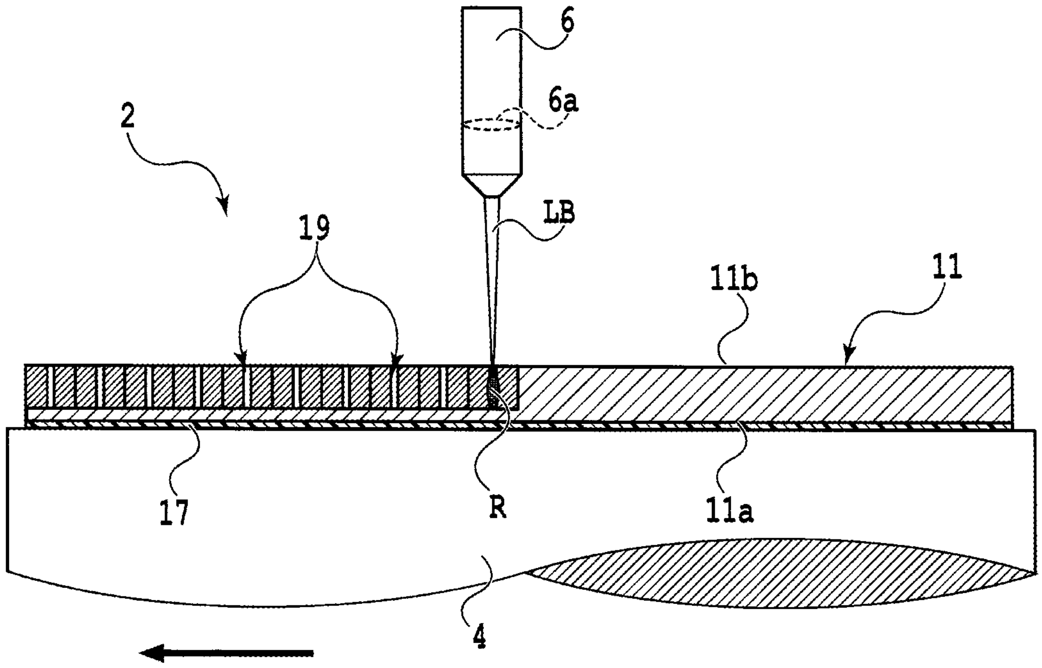
FIG. 5 is a partial cross-sectional side view schematically illustrating how a second example of the shield tunnel forming step, the second example being different from the first example of the shield tunnel forming step as illustrated in FIG. 3A, is performed.

FIG. 5 is a partial cross-sectional side view schematically illustrating how a second example of the shield tunnel forming step S1, the second example being different from the first example of the shield tunnel forming step S1 as illustrated in FIG. 3A, is performed. The second example of the shield tunnel forming step S1 as illustrated in FIG. 5 is performed similarly to the first example of the shield tunnel forming step S1 as illustrated in FIG. 3A, although shield tunnels 19 are formed not to extend through a substrate 11.

Described specifically, these shield tunnels 19 include fine pores 19*a* opening in only a back surface 11*b* of the substrate 11 and amorphous portions 19*b* surrounding the fine pores 19*a*, respectively. As an alternative, these shield tunnels 19 may include fine pores 19*a* opening in only a front surface 11*a* of the substrate 11 and amorphous portions 19*b* surrounding the fine pores 19*a*, respectively.

Further, the construction of a laser processing machine for use in the shield tunnel forming step S1 of the processing method is not limited to the construction of the above-mentioned laser processing machine 2. For example, the shield tunnel forming step S1 may be performed using a laser processing machine that is provided with a vertical direction moving mechanism for moving the holding table 4 in a vertical direction and a horizontal direction moving mechanism for moving the head 6 of a laser beam irradiation unit in a horizontal direction.

As another alternative, the shield tunnel forming step S1 of the processing method may also be performed using a laser processing machine in which a scanning optical system that can change the direction of a laser beam LB emitted from the head 6 is disposed in the laser beam irradiation unit. It is to be noted that this scanning optical system includes, for example, a galvano scanner, an acoustic optical device (AOD), a polygon mirror, and/or the like.

In the shield tunnel forming step S1 of the processing method, it is therefore only required that the substrate 11, which is held on the holding table 4, and the region, in which the laser beam LB applied from the head 6 is to be focused, can be relatively moved along each of the horizontal direction and the vertical direction, and no limitations are imposed on the construction for their relative movement.

Figure 6:
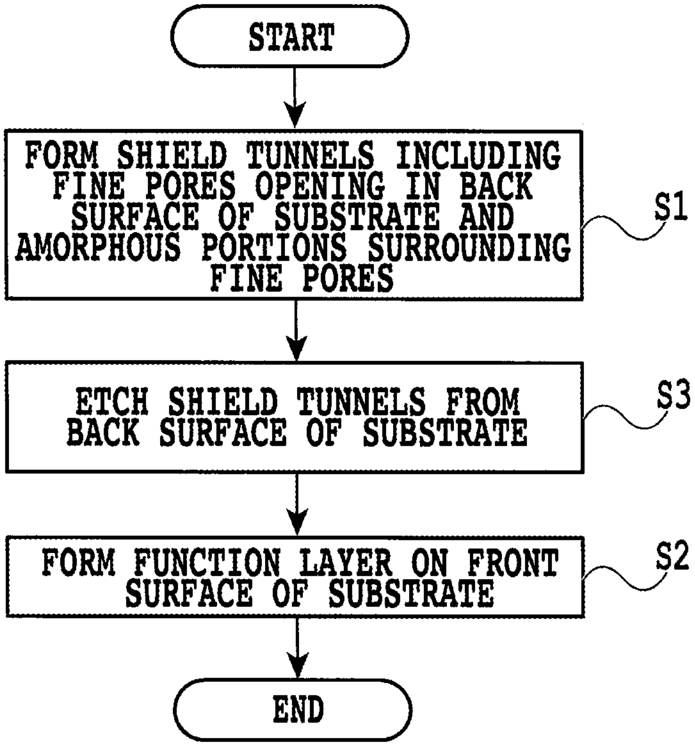
FIG. 6 is a flow chart schematically illustrating a processing method according to a second embodiment of the first aspect of the present invention for the substrate.

In the processing method, the shield tunnels 19 may be removed in part, for example, as much as 65% to 75% before the function layer forming step S2. FIG. 6 is a flow chart schematically illustrating a processing method according to a second embodiment of the first aspect of the present invention for the substrate, in which the shield tunnels 19 are removed in part.

In the processing method of the second embodiment as illustrated in FIG. 6, the shield tunnels 19 are etched from the back surface 11*b* of the substrate 11 between the shield tunnel forming step S1 and the function layer forming step S2 (etching step S3).

Figure 7A:
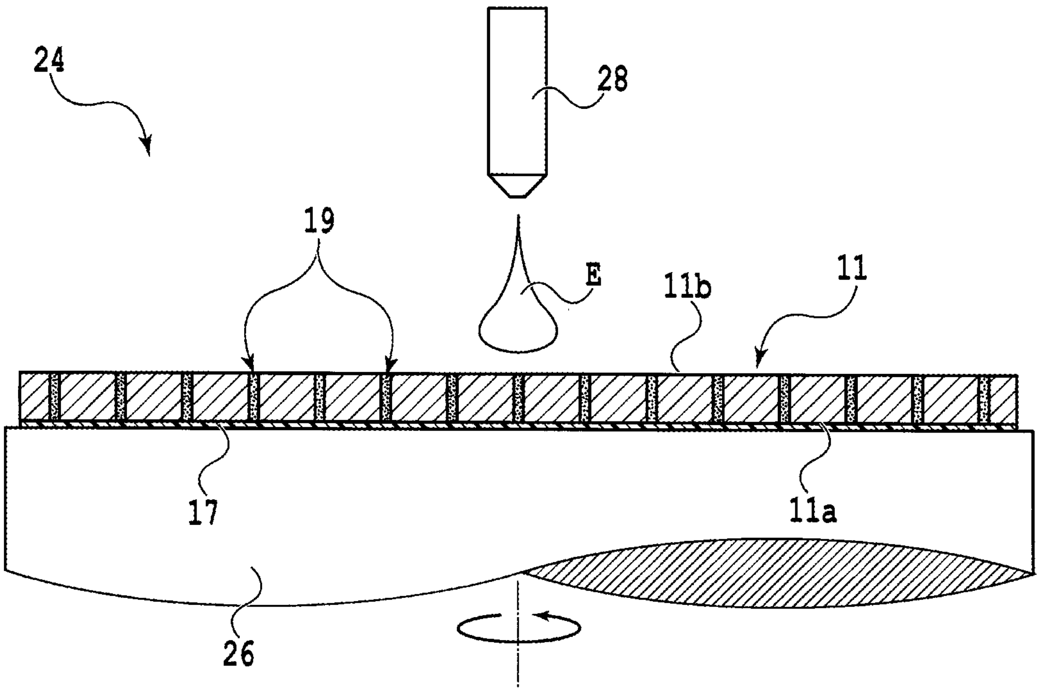
FIG. 7A is a partial cross-sectional side view schematically illustrating how an etching step is performed in the processing method illustrated in FIG. 6.

FIG. 7A is a partial cross-sectional side view schematically illustrating how the etching step S3 is performed in the processing method according to the second embodiment. Described specifically, FIG. 7A illustrates how the shield tunnels 19 formed extending through the substrate 11 are etched in part, for example, in part on a side of the back surface 11*b* with an etchant E in an etching system 24.

The etching system 24 has a holding table 26 similar to the holding table 4 illustrated in FIG. 3A. The holding table 26 also has a porous plate that is in communication with a suction source (not illustrated) such as an ejector via a flow channel formed inside the holding table 26.

When this suction source is activated, a suction force acts on a space in a vicinity of a holding surface of the holding table 26. As a consequence, the substrate 11 placed on the holding surface can be held on the holding table 26.

The holding table 26 is connected to a rotary drive mechanism (not illustrated). This rotatory drive mechanism includes, for example, a spindle, a motor, and the like. When this rotary drive mechanism is activated, the holding table 26 is rotated about, as an axis of rotation, a straight line that passes through a center of the holding surface and extends along a vertical direction.

Above the holding table 26, a nozzle 28 is arranged to supply the etchant E to the substrate 11 held on the holding table 26. This etchant E contains, for example, hydrofluoric acid or the like.

When etching the shield tunnels 19 in part with the etchant E in the etching system 24, the substrate 11 on a front surface 11*a* of which a protective tape 17 is bonded is first placed on the holding table 26 such that the back surface 11*b* is directed upward.

Alternatively, no protective tape 17 may be bonded to the front surface 11*a* of the substrate 11 in the etching step S3. In other words, the substrate 11 may be placed on the holding table 26 such that the front surface 11*a* comes into direct contact with the holding surface of the holding table 26.

The suction source that is in communication with the porous plate exposed in the holding surface of the holding table 26 is next activated. As a consequence, the substrate 11 is held on the holding table 26. While supplying the etchant E to the back surface 11*b* of the substrate 11, the rotary drive mechanism is then activated such that the substrate 11 is spined over a predetermined period of time.

Figure 7B:
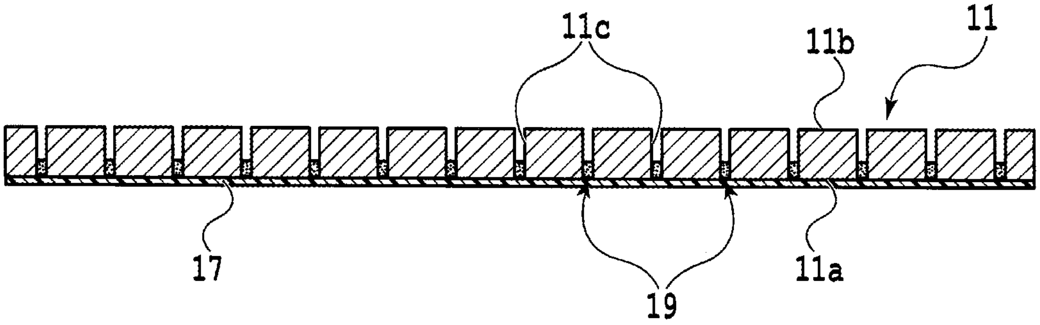
FIG. 7B is a cross-sectional view schematically illustrating the substrate in which shield tunnels have been etched in part through the etching step illustrated in FIG. 7A.

As a consequence, the shield tunnels 19 are etched in part on the side of the back surface 11*b*. FIG. 7B is a cross-sectional view schematically illustrating the substrate 11 in which the shield tunnels 19 have been etched in part.

On the side of the back surface 11*b* of the substrate 11, grooves 11*c* are formed in elongated zones along the scribe lines 13 by this etching. It is to be noted that, in this etching, the substrate 11 may be etched at portions thereof where the shield tunnels 19 have not been formed, that is, at portions thereof overlapping the regions 15 (see FIG. 1).

In the etching step S3, etching may be continued until the shield tunnels 19 are removed in their entirety, in other words, until the substrate 11 is divided along the scribe lines 13.

In the etching step S3, the shield tunnels 19 may be removed in part on the side of the front surface 11*a*. In other words, the shield tunnels 19 may be etched in the etching step S3 from the front surface 11*a* exposed by separating the protective tape 17.

Figure 8:
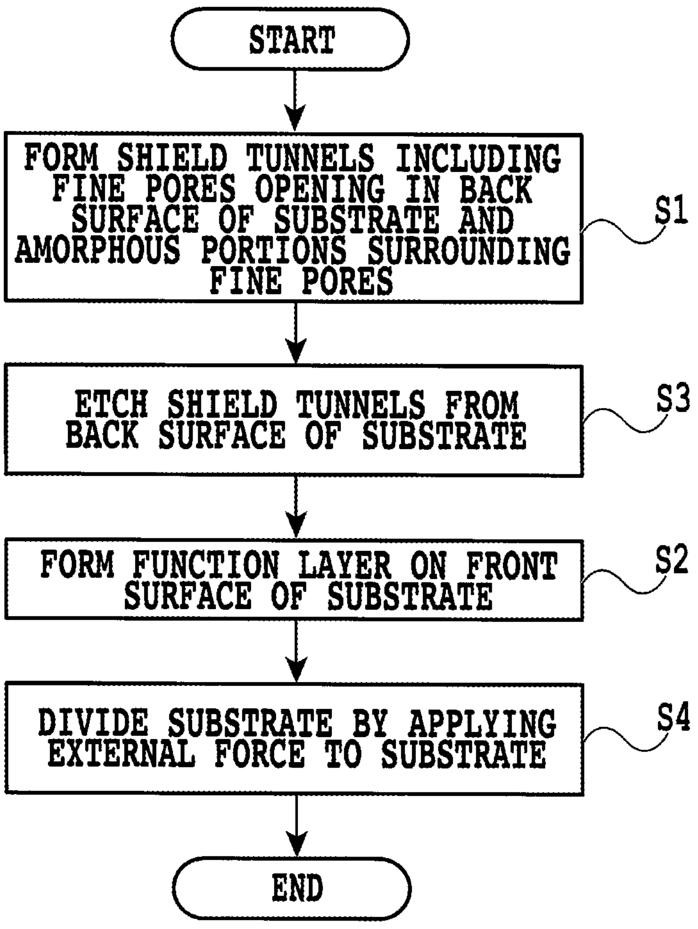
FIG. 8 is a flow chart schematically illustrating a manufacturing method according to a first embodiment of a second aspect of the present invention for chips.

The present invention also relates to a manufacturing method of chips, which includes the above-mentioned processing method of the substrate. FIG. 8 is a flow chart schematically illustrating a manufacturing method according to a first embodiment of a second aspect of the present invention for chips. In the manufacturing method illustrated in FIG. 8, the above-mentioned shield tunnel forming step S1, etching step S3, and function layer forming step S3 are performed in this order.

Figure 9A:
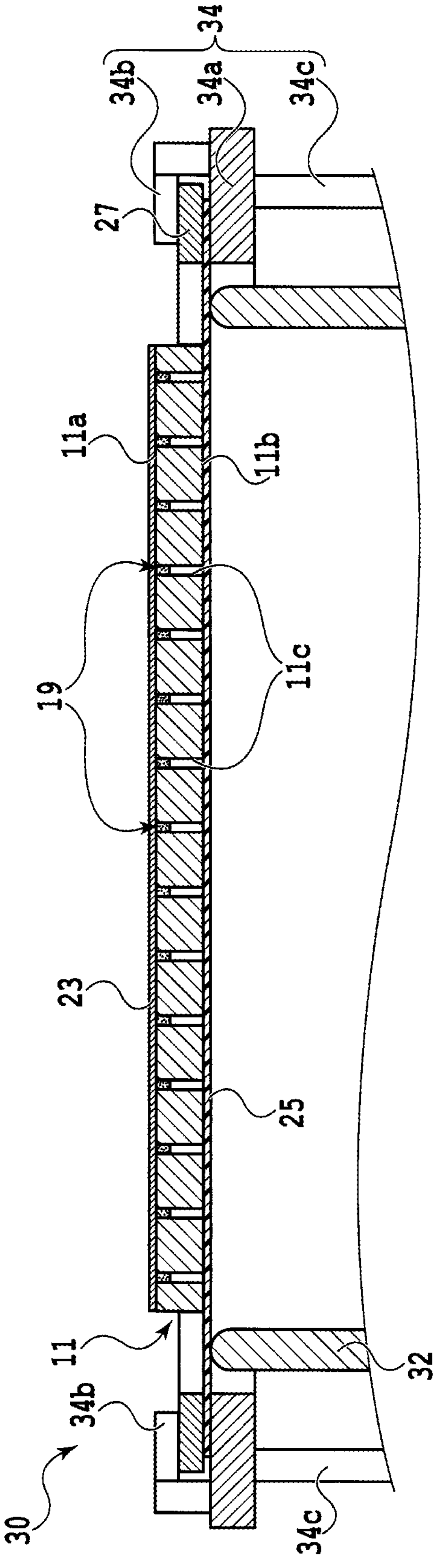
FIG. 9A is a partial cross-sectional side view schematically illustrating how a dividing step is performed, with a frame support base raised, in the manufacturing method illustrated in FIG. 8.
Figure 9B:
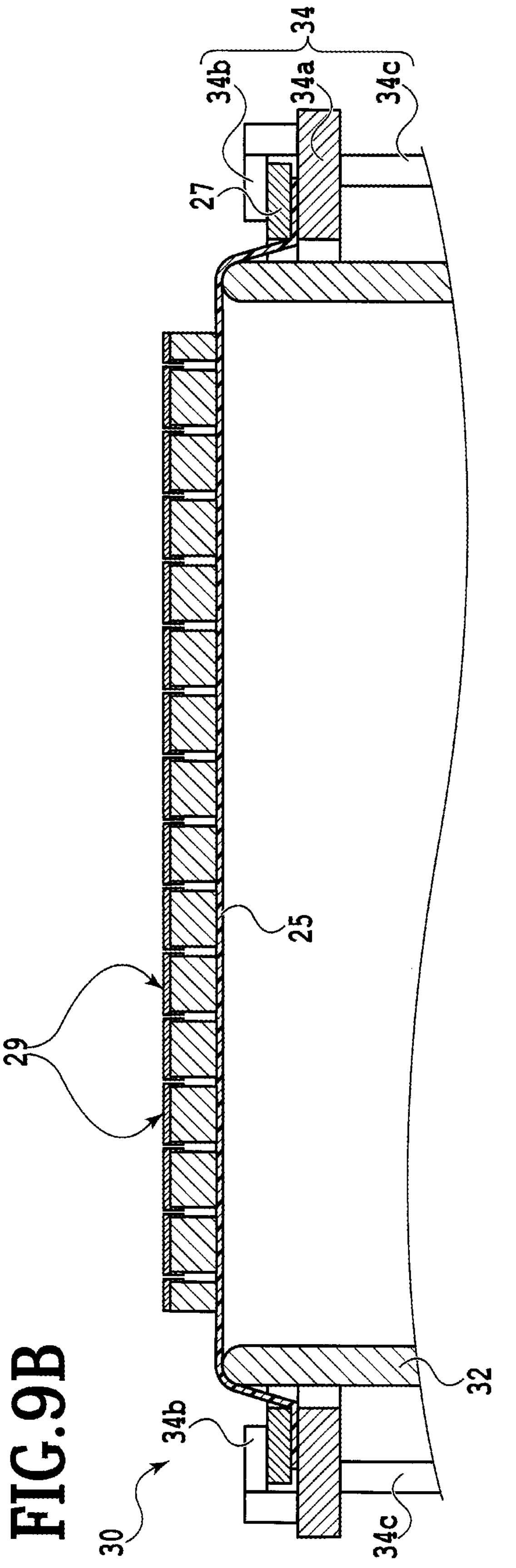
FIG. 9B is a partial cross-sectional side view schematically illustrating how the dividing step is performed, with the frame support base lowered, in the manufacturing method illustrated in FIG. 8.

After the function layer forming step S2, the substrate 11 is then divided by applying an external force to the substrate 11 (dividing step S4). FIGS. 9A and 9B are partial cross-sectional side views schematically illustrating how the dividing step S4 is performed, with a frame support base 34*a* raised and lowered, respectively, in the manufacturing method according to the first embodiment.

Described specifically, in each of FIGS. 9A and 9B, it is illustrated how the substrate 11 and the function layer 23 are divided along the scribe lines 13 on an expansion machine 30 by applying, to the substrate 11 and the function layer 23, such an external force that causes the substrate 11 and the function layer 23 to expand along a radial direction of them.

It is to be noted that, before the dividing step S4, the protective tape 21 is separated from the back surface 11*b* of the substrate 11, and a disk-shaped dicing tape 25 of a greater diameter than the substrate 11 is newly bonded at a central area thereof to the back surface 11*b* of the substrate 11. Also bonded to an outer peripheral area of the dicing tape 25 is an annular frame 27 in which a circular opening of a greater diameter than the substrate 11 is formed.

The expansion machine 30 has a cylindrical drum 32. Around the drum 32, a frame support unit 34 is disposed. The frame support unit 34 has an annular frame support base 34*a* disposed such that it surrounds an upper end portion of the drum 32.

On an upper surface of the frame support base 34*a*, a plurality of clamp portions 34*b* is disposed at substantially equal angular intervals along a peripheral direction of the frame support base 34*a*. When the substrate 11 integrated with the frame 27 with the dicing tape 25 interposed therebetween is loaded onto the expansion machine 30, the frame 27 is placed on the frame support base 34*a* with the dicing tape 25 interposed therebetween, and the frame 27 is clamped by the frame support base 34*a* and the clamp portions 34*b*.

On a lower surface of the frame support base 34*a*, on the other hand, a plurality of rods 34*c* is disposed at substantially equal angular intervals along the peripheral direction of the frame support base 34*a*. The rods 34*c* are, for example, rods of air cylinders, respectively, and are movable up and down. When the rods 34*c* are moved up and down, the frame support base 34*a* and clamp portions 34*b* are also moved up and down along with the rods 34*c*.

When dividing the substrate 11 along the scribe lines 13 on the expansion machine 30, the rods 34*c* are first moved up such that the upper surface of the frame support base 34*a* is positioned on the same plane as an upper end of the drum 32.

The substrate 11 integrated with the frame 27 via the dicing tape 25 is then loaded onto the expansion machine 30 such that the function layer 23 is directed upwards, and the frame 27 is clamped by the frame support base 34*a* and the clamp portions 34*b* (see FIG. 9A). The frame support base 34*a* and clamp portions 34*b* are next moved down along with the rods 34*c*.

As a consequence, the dicing tape 25 is expanded by a distance over which the upper end of the drum 32 and the frame support base 34*a* are separated from each other. At this time, an external force acts on the substrate 11 and also on the function layer 23 such that they are expanded. As a result, the substrate 11 and the function layer 23 are divided along the scribe lines 13 (see FIG. 9B).

Figure 10:
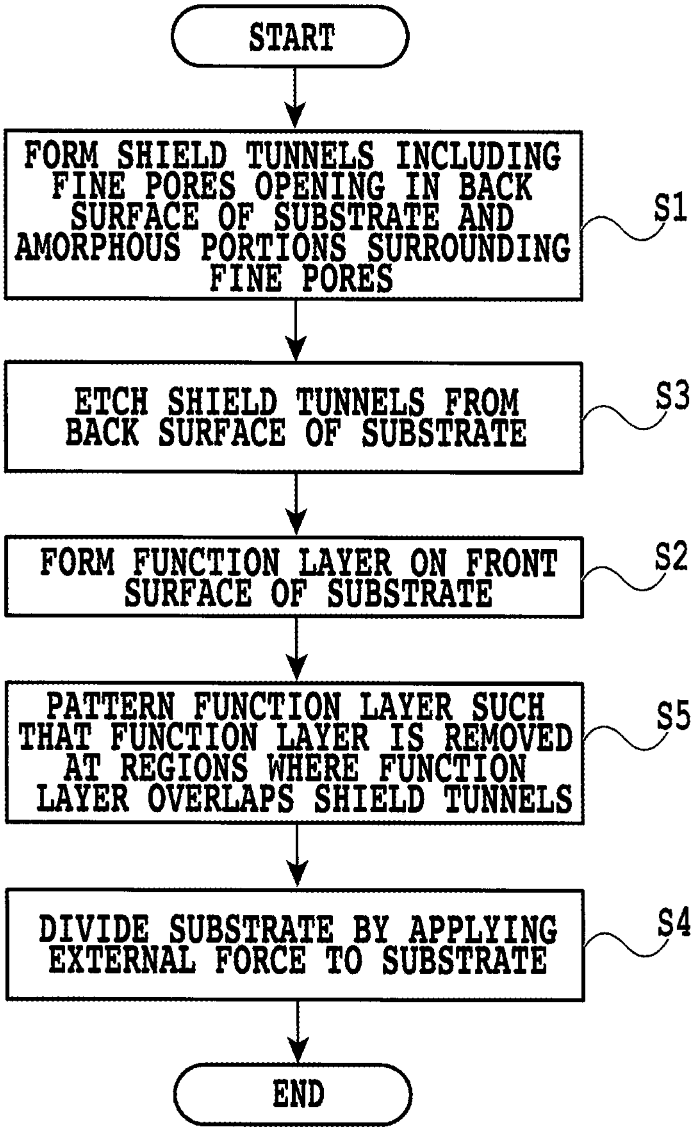
FIG. 10 is a flow chart schematically illustrating a manufacturing method according to a second embodiment of the second aspect of the present invention for the substrate.

It is to be noted that, in the manufacturing method, the function layer 23 may be divided along the scribe lines 13 before the dividing step S4. FIG. 10 is a flow chart schematically illustrating an example of such a manufacturing method of chips as a manufacturing method according to a second embodiment of the second aspect of the present invention.

In the manufacturing method according to the second embodiment as illustrated in FIG. 10, a function layer 23 is patterned between the function layer forming step S2 and the dividing step S4 such that the function layer 23 is removed in regions where the function layer 23 overlaps the shield tunnels 19 (patterning step S5). This patterning step is performed using, for example, photolithography, etching, and so on.

Moreover, the constructions, methods, and the like according to the above-mentioned embodiments can be practiced with appropriate changes or modifications within the scope not departing from the object of the present invention.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A processing method of a substrate, the method performing processing of the substrate with use of a laser beam having a wavelength that transmits through a material constituting the substrate and focused within the substrate, the method comprising:

a shield tunnel forming step of forming shield tunnels, each of which includes a fine pore opening in at least one of a front surface or a back surface of the substrate and an amorphous portion surrounding the fine pore, by applying the laser beam, which is focused in a region, to the substrate such that at least a part of the region is positioned inside the substrate; and a function layer forming step of, after the shield tunnel forming step, forming a function layer on the front surface of the substrate, wherein the function layer forming step comprises forming a metal film, as the function layer, on the front surface of the substrate.

2. The processing method according to claim 1, further comprising:

between the shield tunnel forming step and the function layer forming step, an etching step of etching the shield tunnels from the at least one of the front surface or the back surface, the at least one having the fine pore opening therein.

3. The processing method according to claim 1, wherein the fine pore opens in only one of the front surface or the back surface of the substrate.

4. The processing method according to claim 2, wherein the fine pore opens in only one of the front surface or the back surface of the substrate.

5. A manufacturing method of chips, the method performing manufacture of the chips from a substrate with use of a laser beam having a wavelength that transmits through a material constituting the substrate and focused within the substrate, the method comprising:

a shield tunnel forming step of forming shield tunnels, each of which includes a fine pore opening in at least one of a front surface or a back surface of the substrate and an amorphous portion surrounding the fine pore, by applying the laser beam, which is focused in a region, to the substrate such that at least a part of the region is positioned inside the substrate;

an etching step of, after the shield tunnel forming step, etching the shield tunnels from the at least one of the front surface or the back surface, the at least one having the fine pore opening therein;

a function layer forming step of, after the etching step, forming a function layer on the front surface of the substrate, wherein the function layer forming step comprises a first sub-step of applying a first film of a first material to the front surface of the substrate and a second sub-step of applying a second film of a second material to the front surface of the substrate, and wherein the first material is different than the second material; and a dividing step of, after completing both the first sub-step and the second sub-step of the function layer forming step, dividing the substrate by applying an external force to the substrate.

6. The manufacturing method according to claim 5, wherein the fine pore opens in only one of the front surface or the back surface of the substrate.

7. The processing method according to claim 1, wherein the function layer is made of a plurality of thin metal films.

8. The processing method according to claim 7, wherein the plurality of thin metal films are patterned using at least one of photolithography or etching.

9. A processing method of a substrate, the method performing processing of the substrate with use of a laser beam having a wavelength that transmits through a material constituting the substrate and focused within the substrate, the method comprising:

a shield tunnel forming step of forming shield tunnels, each of which includes a fine pore opening in at least one of a front surface or a back surface of the substrate and an amorphous portion surrounding the fine pore, by applying the laser beam, which is focused in a region, to the substrate such that at least a part of the region is positioned inside the substrate;

a function layer forming step of, after the shield tunnel forming step, forming a function layer on the front surface of the substrate;

a dicing tape applying step of applying a dicing tape to the back surface of the substrate; and a dividing step of, after completing the function layer forming step and the dicing tape applying step, dividing the substrate by applying an external force to the substrate to divide the substrate and the function layer into a plurality of devices that each include a portion of the substate and a portion of the function layer.

10. The processing method according to claim 9, wherein the devices each comprise a light-emitting diode.

11. The processing method according to claim 9, wherein the devices each comprise a laser diode.

12. The processing method according to claim 1, wherein the function layer also includes a semiconductor film, and further wherein the semiconductor film is formed on the substrate after the shield tunnel forming step.

13. The processing method according to claim 5, wherein the function layer is part of an integrated circuit.

14. The manufacturing method according to claim 5, wherein the first material comprises a semiconductor material.

15. The processing method according to claim 9, wherein the devices each comprise an integrated circuit.

16. The manufacturing method according to claim 9, wherein the function layer comprises a metal film.

17. The manufacturing method according to claim 9, wherein the function layer comprises a semiconductor film.

18. The manufacturing method according to claim 5, wherein:

the first material comprises a semiconductor material; and the second material comprises an insulating material.

19. The manufacturing method according to claim 1, wherein the function layer forming step forms the metal film using chemical vapor deposition.

20. The manufacturing method according to claim 1, wherein the function layer forming step forms the metal film using physical vapor deposition.

* * * * *